United States Patent [19]

Sakai et al.

[11] Patent Number: 5,233,669
[45] Date of Patent: Aug. 3, 1993

[54] DEVICE FOR AND METHOD OF DETECTING POSITIONING MARKS FOR CUTTING CERAMIC LAMINATED BODY

[75] Inventors: Norio Sakai; Masahiro Itou; Masanobu Iwasa, all of Nagaokakyo, Japan

[73] Assignee: Murata Manufacturing Co., Ltd., Japan

[21] Appl. No.: 795,688

[22] Filed: Nov. 21, 1991

[30] Foreign Application Priority Data

Nov. 22, 1990 [JP] Japan .................. 2-319137

[51] Int. Cl.⁵ .............................................. G06K 9/80
[52] U.S. Cl. ........................................... 382/8; 382/1; 358/101
[58] Field of Search ............... 382/8, 17, 1; 358/101; 356/375; 395/133

[56] References Cited

U.S. PATENT DOCUMENTS

| | | | |
|---|---|---|---|
| 4,167,677 | 9/1979 | Suzki | 356/401 |
| 4,348,592 | 9/1982 | Kimura et al. | 250/560 |
| 4,655,598 | 4/1987 | Murakami et al. | 356/400 |
| 4,807,296 | 2/1989 | Ando et al. | 382/8 |
| 5,058,178 | 10/1991 | Ray | 382/8 |
| 5,058,181 | 10/1991 | Ishihara et al. | 382/21.22 |
| 5,086,478 | 2/1992 | Kelley-Mahaffey et al. | 382/8 |

FOREIGN PATENT DOCUMENTS 0200814 11/1986 European Pat. Off. .

Primary Examiner—Michael T. Razavi
Assistant Examiner—Steven P. Klocinski
Attorney, Agent, or Firm—Ostrolenk, Faber, Gerb & Soffen

[57] ABSTRACT

A device for detecting positioning marks for cutting a ceramic laminated body having a plurality of inner electrodes formed therein and having a plurality of positioning marks for cutting so formed on its outer side surfaces as to have a predetermined positional relationship with the inner electrodes, which comprises a device for detecting image information obtained from the outer side surfaces of the ceramic laminated body, a binary-coding device for binary-coding the image information detected by the detecting device based on a color density, an image memory for storing the image information binary-coded by the binary-coding device, a characteristic extractor for extracting signal regions having a color density not less than a predetermined color density from the image information stored in the image memory, removing regions having an area not more than a predetermined area and regions having a length in the lateral direction not less than a predetermined length out of the signal regions extracted, and selecting the remaining regions as candidates for positioning marks for cutting, and a middle point calculating device for calculating a middle point of the positioning marks for cutting on the basis of the candidates for positioning marks for cutting obtained by the characteristic extractor.

14 Claims, 4 Drawing Sheets

DEVICE FOR AND METHOD OF DETECTING POSITIONING MARKS FOR CUTTING CERAMIC LAMINATED BODY

BACKGROUND OF THE INVENTION

1. Field of the Invention

The present invention relates generally to a device for and a method of detecting positioning marks in cutting a ceramic laminated body used for, for example, ceramic laminated electronic components, and more particularly, to a device for and a method of picking up an image in portions where positioning marks are formed and processing image information obtained to detect the position of a middle point of the positioning marks.

2. Description of the Prior Art

A ceramic laminated electronic component represented by a multilayer capacitor is formed by sintering a laminated body obtained by laminating a plurality of ceramic green sheets each having inner electrodes materials printed thereon and providing outer electrodes on the outer surface of a sintered body obtained. Generally, a plurality of mother ceramic green sheets each having inner electrodes printed thereon are laminated and a mother laminated body thus obtained is cut in the direction of thickness, thereby to obtain respective laminated bodies for a multilayer capacitor in order to increase productivity.

FIG. 2 is a plan view showing a mother ceramic green sheet as described above. A plurality of inner electrode materials 2 are printed with a predetermined pitch on the upper surface of the mother ceramic green sheet 1. In addition, positioning marks for cutting 3 are formed in the outer peripheral part of the upper surface of the mother ceramic green sheet 1. The positioning marks for cutting 3 are so formed as to have a predetermined positioning relationship with the inner electrodes 2.

In obtaining the respective laminated bodies for a multilayer capacitor, a plurality of mother ceramic green sheets 1 are laminated, to obtain a mother laminated body 4. Thereafter, the outer peripheral surface of the mother laminated body obtained is cut, to expose the positioning marks for cutting 3 to the outer side surfaces of the mother laminated body 4, as shown in FIG. 3.

As shown in FIGS. 4 and 5, the above described mother laminated body 4 is mounted on a cutting table 5. The cutting table 5 is constructed movably in the direction of the Y-axis and the direction of the $\theta$-axis as shown. In the case of cutting, the positioning marks appearing on the outer side surfaces of the laminated body 4 are confirmed by the naked eye using cameras 7.

FIG. 6 shows a field of vision 8 for the cameras 7. In the case of cutting, the left end (indicated by a one-dot and dash line A) and the right end (indicated by a one-dot and dash line B) of a plurality of positioning marks for cutting 3 which are overlapped with each other in the direction of thickness are determined while observing the field of vision 8, and the middle between the left end and the right end, that is, a middle point (which exists on a line indicated by a one-dot and dash line C) is determined, to cut the mother laminated body 4 in a cutting position D (indicated by a broken line) spaced apart from the middle point by a predetermined distance on the basis of the middle point.

Meanwhile, when a cutting edge (not shown) is not located above the cutting position D, the cutting table 5 is moved in the direction of the Y-axis or the direction of the $\theta$-axis such that the cutting edge is located directly over the cutting position D, to perform the cutting work.

In the above described conventional method of cutting a ceramic laminated body, however, the middle point of a group of the positioning marks for cutting 3 which are overlapped with each other in the direction of thickness is determined on the basis of the results of the observation by the naked eye. Accordingly, the variation in measurement is large and it takes long to determine the middle point.

SUMMARY OF THE INVENTION

Accordingly, an object of the present invention is to provide a device for and a method of detecting middle point of a group of positioning marks for cutting accurately and instantaneously.

The present invention is directed to a device for and a method of detecting positioning marks for cutting a ceramic laminated body having a plurality of inner electrodes formed therein and intended to be cut in the direction of thickness on the basis of positioning marks for cutting so provided on its outer side surfaces as to have a predetermined positional relationship with the above inner electrodes.

A device for detecting positioning marks for cutting a ceramic laminated body according to the present invention is characterized by comprising detecting means for detecting image information obtained from the outer side surfaces of a ceramic laminated body; binary-coding means for binary-coding the image information detected by the above detecting means based on a color density; storing means for storing the image information binary-coded by the above binary-coding means; characteristic extracting means for extracting signal regions having a color density not less than a predetermined color density out of the binary-coded image information stored in the above storing means, removing signal regions having an area not more than a predetermined area and signal regions having a length in the lateral direction not less than a predetermined length, and selecting the remaining signal regions as candidates for positioning marks for cutting; and middle point calculating means for calculating an enlarged circumscribed rectangle obtained by enlarging a rectangle circumscribing each of the candidates for positioning marks obtained by the above characteristic extracting means to a predetermined size, dividing all the candidates for positioning marks into groups such that the candidates for positioning marks whose enlarged circumscribed rectangles are overlapped with each other constitute one group, selecting as a group of positioning marks for cutting a group in which the sum of the areas of all the candidates for positioning marks is the largest out of the groups obtained, and calculating a middle point between the leftmost end and the rightmost end of the selected group of positioning marks for cutting.

Furthermore, a method of detecting positioning marks for cutting a ceramic laminated body according to the present invention is characterized by comprising the steps of detecting image information obtained from the outer side surfaces of a ceramic laminated body; binary-coding the detected image information based on a color density; storing a binary-coded image signal in storing means; extracting signal regions having a color density not less than a predetermined color density from the binary-coded image signal stored in the storing means, removing signal regions having an area not more than a predetermined area as well as signal regions having a length in the lateral direction not less than a predetermined length out of the signal regions, and selecting the remaining signal regions as candidates for positioning marks for cutting; and calculating an enlarged circumscribed rectangle obtained by enlarging a rectangle circumscribing each of the selected candidates for positioning marks to a predetermined size, dividing all the candidates for positioning marks into groups such that the candidates for positioning marks whose enlarged circumscribed rectangles are overlapped with each other constitute one group, selecting as a group of positioning marks for cutting a group in which the sum of the areas of all the candidates for positioning marks is the largest out of the groups obtained, and calculating a middle point between the leftmost end and the rightmost end of the selected group of positioning marks.

In the present invention, an image on the outer surface of the ceramic laminated body on which the positioning marks are arranged is detected as image information by the detecting means, and the image information is subjected to image processing, thereby to detect the position of a middle point of the positioning marks. Consequently, a middle point of a group of positioning marks can be detected without depending on the naked eye, thereby to make it possible to detect the middle point of the group of possible marks accurately and rapidly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
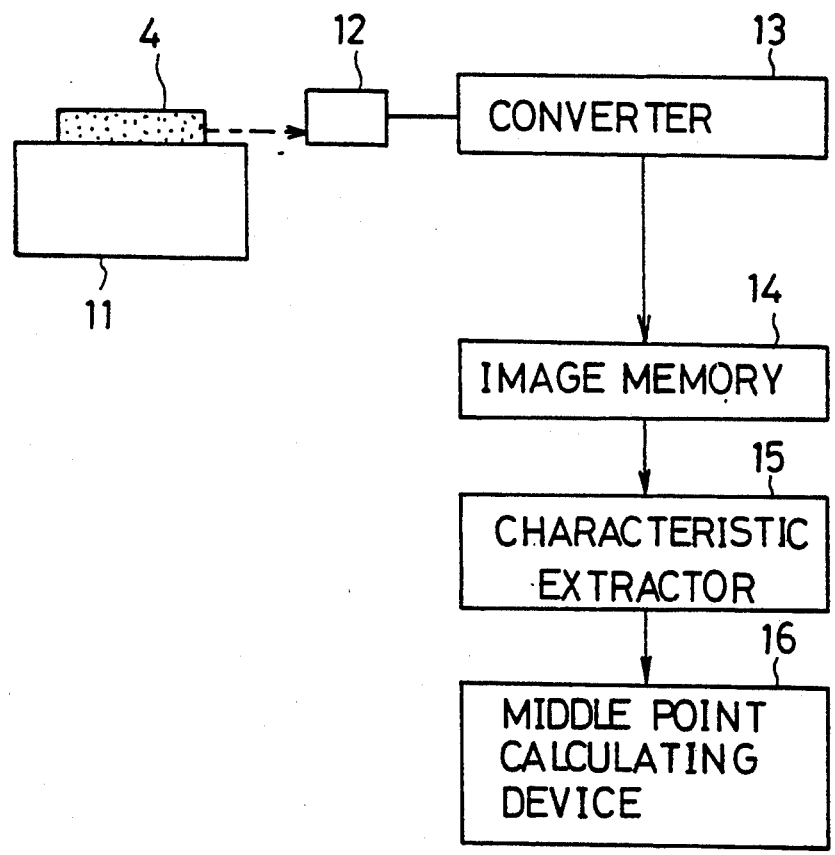
FIG. 1 is a schematic block diagram for explaining a device for detecting positioning marks for cutting according to one embodiment of the present invention.
Figure 2:
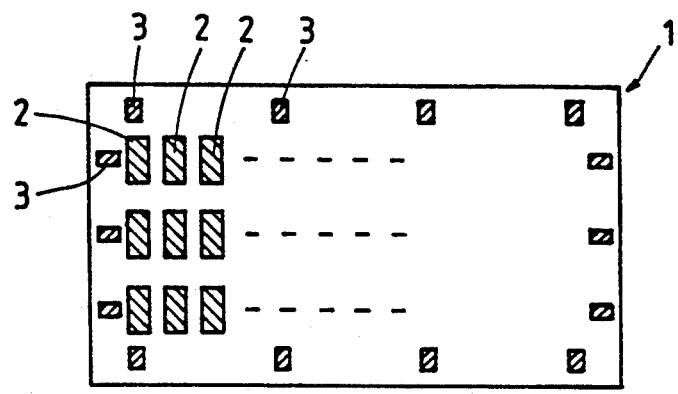
FIG. 2 is a plan view showing inner electrode materials and positioning marks for cutting which are formed on a mother ceramic green sheet.
Figure 3:
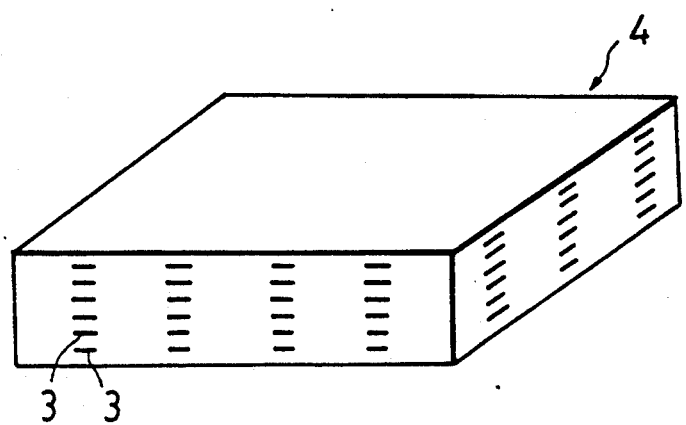
FIG. 3 is a perspective view showing a mother ceramic laminated body having positioning marks appearing on its outer side surfaces.
Figure 4:
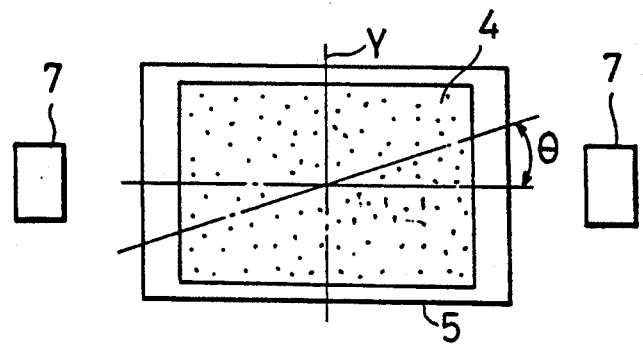
FIGS. 4 and 5 are a plan view and a front view for explaining a device for cutting a conventional mother ceramic laminated body, respectively.
Figure 5:
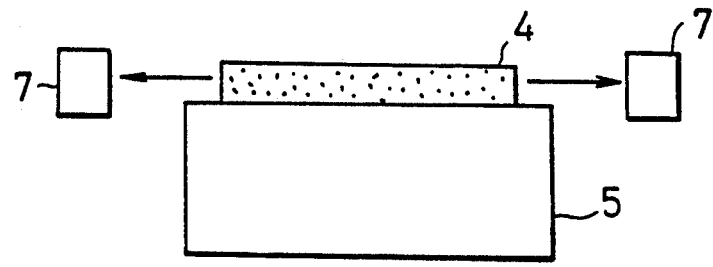
Figure 6:
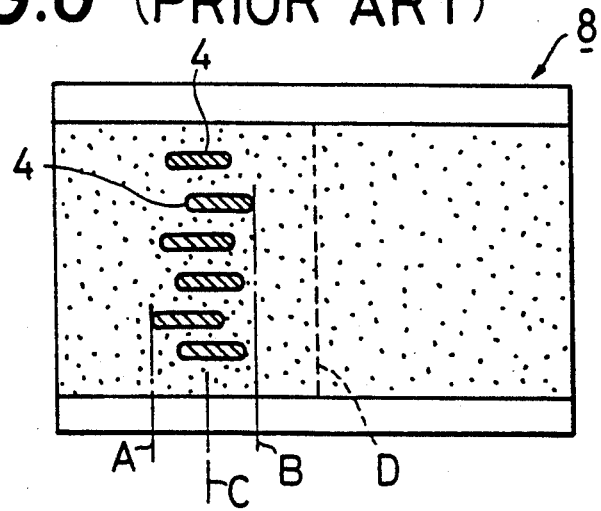
FIG. 6 is a diagram for explaining a field of vision for cameras in the conventional example.

FIG. 1 is a schematic block diagram showing a positioning mark detecting device according to one embodiment of the present invention. A mother ceramic laminated body 4 is mounted on a stage 11. The stage 11 is constructed similarly to the cutting stage 5 in the description of the prior art. More specifically, the stage 11 is so constructed that it can be moved in the direction of the Y-axis and the direction of the $\theta$-axis shown in FIG. 4.

A camera 12 is disposed in the side part of the mother ceramic laminated body 4. The camera 12 is so provided as to image the outer side surfaces of the ceramic laminated body 4 on the basis of light irradiated to the outer side surfaces of the ceramic laminated body 4 from a light source (not shown). This camera 12 images the outer side surfaces of the ceramic laminated body 4 and outputs its image information in the form of an analog signal.

An analog-to-digital converter 13 serving as binary-coding means is connected to the camera 12, to binary-code an image information signal outputted from the camera 12 based on a color density.

An image memory 14 is connected to the analog-to-digital converter 13, to store the image information signal binary-coded by the analog-to-digital converter 13.

A characteristic extractor 15 is connected to the image memory 14, to extract positioning marks and regions similar to the positioning marks, that is, candidates for positioning marks from the image information obtained from the outer side surfaces of the mother ceramic laminated body 4. In addition, a middle point calculating device 16 is connected to the characteristic extractor 15, to select positioning marks from the candidates for positioning marks for cutting selected by the characteristic extractor 15 and calculate a middle point of a group of positioning marks for cutting.

Figure 7:
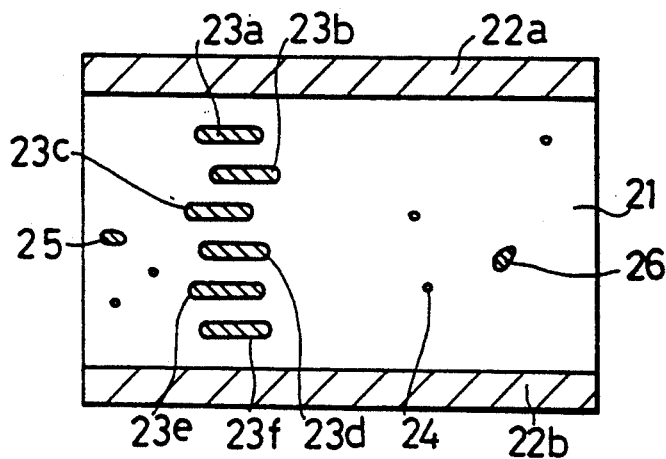
FIG. 7 is a diagram for explaining image information stored in an image memory according to the present embodiment.

FIG. 7 is a diagram schematically showing an image of the mother ceramic laminated body 4 picked up by the camera 12. In FIG. 7, reference numeral 21 denotes the outer side surface of the mother ceramic laminated body 4, and reference numerals 22a and 22b denote backgrounds. In addition, portions hatched in a direction different from hatching of the backgrounds 22a and 22b are portions having a color density relatively higher than that of the surrounding portions of the mother ceramic laminated body 4, which have a color density intrinsically that of the ceramic laminated body and include positioning marks 23a to 23f and spots 24 to 26.

In the above described analog-to-digital converter 13, the backgrounds 22a and 22b, the positioning marks 23a to 23f, the spots 24 to 26 and the like are distinguished from the base portion of the outer side surface 21 of the ceramic laminated body 4 on the basis of the difference in color density.

In the characteristic extractor 15, regions having a color density not less than a predetermined color density, that is, regions hatched are first extracted from the image information signal based on the image shown in FIG. 7 and then, it is determined whether or not each of the regions has an area not more than a predetermined area and has a length in the lateral direction not less than a predetermined length, to remove the regions having an area not more than the predetermined area and the regions having a length in the lateral direction not less than the predetermined length. This predetermined area is previously determined so as to distinguish the positioning marks 23a to 23f from the spot 24 which is significantly smaller than the positioning marks 23a to 23f, and is set to a suitable area depending on the sizes of the ceramic laminated body and the positioning marks. On the other hand, the above described predetermined length in the lateral direction is determined so as to distinguish the positioning marks 23a to 23f from the backgrounds 22a and 22b, and is also set to a suitable length depending on the sizes of the ceramic laminated body and the positioning marks.

In the above described manner, in the characteristic extractor 15, the spot 24 having an area much smaller than that of the positioning marks 23a to 23f is removed, and the remaining regions having a color density not less than a predetermined color density, that is, the positioning marks 23a to 23f and the spots 25 and 26 are selected as candidates for positioning marks.

The following calculation is performed in the middle point calculating device 16 using the regions selected in the characteristic extractor 15 as candidates for positioning marks, to detect the position of a middle point of a group of positioning marks.

Figure 8:
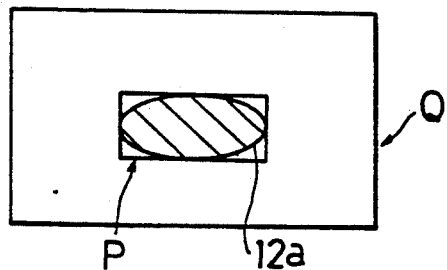
FIG. 8 is a schematic view for explaining a rectangle circumscribing a positioning mark and an enlarged circumscribed rectangle.

As shown in FIG. 8, a rectangle P circumscribing, for example, a candidate for a positioning mark 12a selected is first calculated. For example, U.S. Pat. No. 5,058,181 teaches a system that may be used for calculating the area of the circumscribed rectangle P, and other similar geometric features. Similarly, an enlarged circumscribed rectangle Q obtained by enlarging the rectangle P to a predetermined size is calculated. Then, all the candidates for positioning marks are divided into groups such that the candidates for positioning marks whose enlarged circumscribed rectangles Q are overlapped with each other constitute one group. These features of the invention are known in the prior art, as disclosed, for example, in aforementioned U.S. Pat. No. 5,058,181, and, therefore, are not discussed in detail here. More specifically, in FIG. 7, the positioning marks 23a to 23f constitute one group, and the relatively large spots 25 and 26 constitute two separate groups, respectively.

A group in which the sum of the areas of all the candidates for positioning marks is the largest is then selected out of the groups obtained, to determine the group as a group of positioning marks for cutting. More specifically, in FIG. 7, the group comprising the positioning marks 23a to 23f is determined as a group of positioning marks because the sum of the areas of the candidates for positioning marks in the group is the largest.

Figure 9:
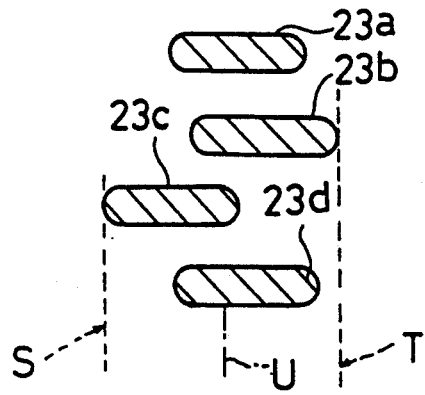
FIG. 9 is a schematic view for explaining the step of finding a middle point of positioning marks.

Additionally, as shown in FIG. 9, the position of a middle point U is calculated on the basis of the leftmost end and the rightmost end (respectively indicated by broken lines S and T) of the positioning marks 23a to 23d (23e and 23f are omitted in FIG. 9) in the selected group of positioning marks.

The cutting stage shown in FIG. 1 is moved in the direction or the Y-axis and the direction of the $\theta$-axis on the basis of the position of the middle point obtained in the above described manner, to cut the mother ceramic laminated body 4 in the direction of thickness in a predetermined cutting position.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A device for calculating a middle point for positioning marks provided on outer side surfaces of a ceramic laminated body for cutting said laminated body along a direction corresponding to the thickness, the positioning marks having predetermined color density and being of predetermined area and length, said device comprising:

detecting means for detecting image information obtained from said side surfaces to produce a corresponding image signal representing color density, area and length of regions of said side surfaces which are to be extracted as candidate positioning marks;

binary coding means for converting said image signal into a binary signal based on a predetermined color density;

storing means for storing said binary signal;

characteristic extracting means for extracting said regions of said side surfaces from said binary signal stored in said storing means, as candidate positioning marks, said extraction being done by selecting regions, from said binary signal, having a color density at least equal to said predetermined color density, and eliminating therefrom regions having an area less than or equal to a predetermined area and regions having a length greater than or equal to a predetermined length, said length of said regions being measured along a direction perpendicular to said thickness direction of said laminated body; and middle point calculating means for calculating a middle point of a group of positioning marks selected from said candidate positioning marks by:
   (i) defining a rectangle to circumscribe each of said candidate positioning marks thereby forming a plurality of circumscribed rectangles;
   (ii) enlarging each of said circumscribed rectangles to a predetermined size to obtain enlarged circumscribed rectangles;
   (iii) observing said enlarged circumscribed rectangles to determine overlapping of said enlarged circumscribed rectangles with each other;
   (iv) separating said candidate positioning marks into groups to form a plurality of groups with each group comprising only candidate positioning marks having overlapping enlarged circumscribed rectangles;
   (v) calculating areas of each of said overlapping enlarged circumscribed rectangles;
   (vi) adding up said areas in each respective one of said plurality of groups whereby a group having the largest sum of the areas is selected as said group of positioning marks; and
   (vii) calculating said middle point for said group of positioning marks, said middle point lying between a left end and a right end of said group of positioning marks, said left end of said group being fixed by the left end of the leftmost positioning mark in said group and the right end of the group being fixed by the right end of the rightmost positioning mark in said group.

2. The device according to claim 1, wherein said predetermined color density is a color density between a first color density of said ceramic laminated body and a second color density of said positioning marks.

3. A method for calculating a middle point for positioning marks provided on outer side surfaces of a ceramic laminated body for cutting said laminated body along a direction corresponding to the thickness, the positioning marks having predetermined color density and being of predetermined area and length, said method comprising:

obtaining image information from said side surfaces to produce a corresponding image signal representing color density, area and length of regions of said side surfaces which are to be extracted as candidate positioning marks;

converting said image signal into a binary signal based on a predetermined color density;

extracting said regions of said side surfaces from said binary signal, as candidate positioning marks, said extraction being done by selecting regions, from said binary signal, having a color density at least equal to said predetermined color density, and eliminating therefrom regions having an area less than or equal to a predetermined area and regions having a length greater than or equal to a predetermined length, said length of said regions being measured along a direction perpendicular to said thickness direction of said laminated body;

selecting a group of positioning marks from said candidate positioning marks, said group being selected by:
  (i) defining a rectangle to circumscribe each of said candidate positioning marks thereby forming a plurality of circumscribed rectangles;
  (ii) enlarging each of said circumscribed rectangles to a predetermined size to obtain enlarged circumscribed rectangles;
  (iii) observing said enlarged circumscribed rectangles to determine overlapping of said enlarged circumscribed rectangles with each other;
  (iv) separating said candidate positioning marks into groups to form a plurality of groups with each group comprising only candidate positioning marks having overlapping enlarged circumscribed rectangles;
  (v) calculating areas of each of said overlapping enlarged circumscribed rectangles; and
  (vi) adding up said areas in each respective one of said plurality of groups whereby a group having the largest sum of the areas is selected as said group of positioning marks; and calculating a middle point for said group of positioning marks, said middle point lying between a left end and a right end of said group of positioning marks, said left end of said group being fixed by the left end of the leftmost positioning mark in said group and the right end of the group being fixed by the right end of the rightmost positioning mark in said group.

4. The method according to claim 3, wherein said predetermined color density is a color density between a first color density of said ceramic laminated body and a second color density of said positioning marks.

5. A device for calculating a middle point for marks provided on a ceramic laminated body, said device comprising:

detecting means for detecting image information obtained from said laminated body to produce a corresponding image signal representing regions of said laminated body which are to be extracted as candidate marks;

binary coding means for converting said image signal into a binary signal;

storing means for storing said binary signal;

characteristic extracting means for extracting regions of said laminated body from said binary signal stored in said storing means as candidate marks; and middle point calculating means for calculating a middle point of a group of marks selected from said candidate marks, said group being selected by:
  (i) defining a rectangle to circumscribe each of said candidate marks thereby forming a plurality of circumscribed rectangles;
  (ii) enlarging each of said circumscribed rectangles to a predetermined size to obtain enlarged circumscribed rectangles;
  (iii) observing said enlarged circumscribed rectangles to determine overlapping of said enlarged circumscribed rectangles with each other;
  (iv) separating said candidate marks into groups to form a plurality of groups with each group comprising only regions having overlapping enlarged circumscribed rectangles;
  (v) calculating areas of each of said overlapping enlarged circumscribed rectangles;
  (vi) adding up said areas in each respective one of said plurality of groups whereby a group having the largest sum of the areas is selected as said group of marks; and
  (vii) calculating a middle point for said group of marks, said middle point lying between a left end and a right end of said group of marks, said left end of said group being fixed by the left end of the leftmost mark in said group and the right end of the group being fixed by the right end of the rightmost mark in said group.

6. A device according to claim 5, wherein said marks comprise positioning marks provided on outer side surfaces of said ceramic laminated body for cutting said laminated body along a direction corresponding to the thickness, the positioning marks having predetermined color density and being of predetermined area and length.

7. A device according to claim 6, wherein said binary coding means converts said image signal into a binary signal based on a predetermined color density.

8. A device according to claim 7, wherein said characteristic extracting means extracts said regions by selecting regions, from said binary signal, having a color density at least equal to said predetermined color density, and eliminating therefrom regions having an area less than or equal to a predetermined area and regions having a length greater than or equal to a predetermined length, said length of said regions being measured along a direction perpendicular to said thickness direction of said laminated body.

9. A device according to claim 8, wherein said predetermined color density is a color density between a first color density of said ceramic laminated body and a second color density of said positioning marks.

10. A method for calculating a middle point for marks provided on a ceramic laminated body, said method comprising:

obtaining image information from said laminated body to produce a corresponding image signal representing regions of said laminated body which are to be extracted as candidate marks;

converting said image signal into a binary signal;

extracting regions of said laminated body from said binary signal as candidate marks;

selecting a group of marks from said candidate marks, said group being selected by:
  (i) defining a rectangle to circumscribe each of said candidate marks thereby forming a plurality of circumscribed rectangles;

(ii) enlarging each of said circumscribed rectangles to a predetermined size to obtain enlarged circumscribed rectangles;

(iii) observing said enlarged circumscribed rectangles to determine overlapping of said enlarged circumscribed rectangles with each other;

(iv) separating said candidate marks into groups to form a plurality of groups with each group comprising only regions having overlapping enlarged circumscribed rectangles;

(v) calculating areas of each of said overlapping enlarged circumscribed rectangles; and (vi) adding up said areas in each respective one of said plurality of groups whereby a group having the largest sum of the areas is selected as said group of marks; and calculating a middle point for said group of marks, said middle point lying between a left end and a right end of said group of marks, said left end of said group being fixed by the left end of the leftmost mark in said group and the right end of the group being fixed by the right end of the rightmost mark in said group.

11. A method according to claim 10, wherein said marks comprise positioning marks provided on outer side surfaces of said ceramic laminated body for cutting said laminated body along a direction corresponding to the thickness, the positioning marks having predetermined color density and being of predetermined area and length.

12. A method according to claim 11, wherein said image signal is converted into a binary signal based on a predetermined color density.

13. A method according to claim 12, wherein said regions are extracted by selecting regions, from said binary signal, having a color density at least equal to said predetermined color density, and eliminating therefrom regions having an area less than or equal to a predetermined area and regions having a length greater than or equal to a predetermined length, said length of said regions being measured along a direction perpendicular to said thickness direction of said laminated body.

14. A method according to claim 13, wherein said predetermined color density is a color density between a first color density of said ceramic laminated body and a second color density of said positioning marks.

* * * * *